US006832122B1

(12) United States Patent
Huber

(10) Patent No.: US 6,832,122 B1
(45) Date of Patent: Dec. 14, 2004

(54) SYSTEM AND METHOD FOR COMPARING ELECTRONICS MANUFACTURING DATA

(75) Inventor: Robert Huber, Duluth, GA (US)

(73) Assignee: Siemens Electronics Assembly Systems, Inc., Norcross, GA (US)

( * ) Notice: Subject to any disclaimer, the term of this patent is extended or adjusted under 35 U.S.C. 154(b) by 390 days.

(21) Appl. No.: 09/716,018

(22) Filed: Nov. 17, 2000

Related U.S. Application Data
(60) Provisional application No. 60/216,284, filed on Jul. 6, 2000.

(51) Int. Cl.[7] .............................................. G06F 19/00
(52) U.S. Cl. ......................... 700/95; 700/108; 700/117; 700/121; 702/81
(58) Field of Search .......................... 700/97, 109, 121, 700/95, 99, 117, 91, 96; 702/81, 82, 83, 84

(56) References Cited

U.S. PATENT DOCUMENTS

| | | | | |
|---|---|---|---|---|
| 5,172,468 A | * | 12/1992 | Tanaka et al. | 29/721 |
| 5,191,534 A | * | 3/1993 | Orr et al. | 700/105 |
| 5,325,305 A | * | 6/1994 | Rezaei | 700/114 |
| 5,745,390 A | * | 4/1998 | Daneshgari | 700/109 |
| 5,778,386 A | * | 7/1998 | Lin et al. | 700/121 |
| 5,805,722 A | * | 9/1998 | Cullen et al. | 382/146 |
| 5,806,069 A | * | 9/1998 | Wakiyama et al. | 700/97 |
| 5,844,803 A | * | 12/1998 | Beffa | 700/121 |
| 5,889,674 A | * | 3/1999 | Burdick et al. | 700/121 |
| 5,933,349 A | * | 8/1999 | Dalgleish et al. | 700/97 |
| 6,442,496 B1 | * | 8/2002 | Pasadyn et al. | 702/83 |
| 6,487,472 B1 | * | 11/2002 | Song et al. | 700/121 |
| 6,556,884 B1 | * | 4/2003 | Miller et al. | 700/121 |

* cited by examiner

*Primary Examiner*—Leo Picard
*Assistant Examiner*—Charles Kasenge

(57) ABSTRACT

A server exchange utility for exchanging manufacturing information from a number of geographically dispersed sites is provided in combination with a difference editor for comparing differences between objects representing the manufacturing information. The exchange utility stores all manufacturing information at a central location including global manufacturing information and copies of local manufacturing information for each manufacturing site. The difference editor uses a GUI to provides an organized, easy-to-read interface to the system.

17 Claims, 3 Drawing Sheets

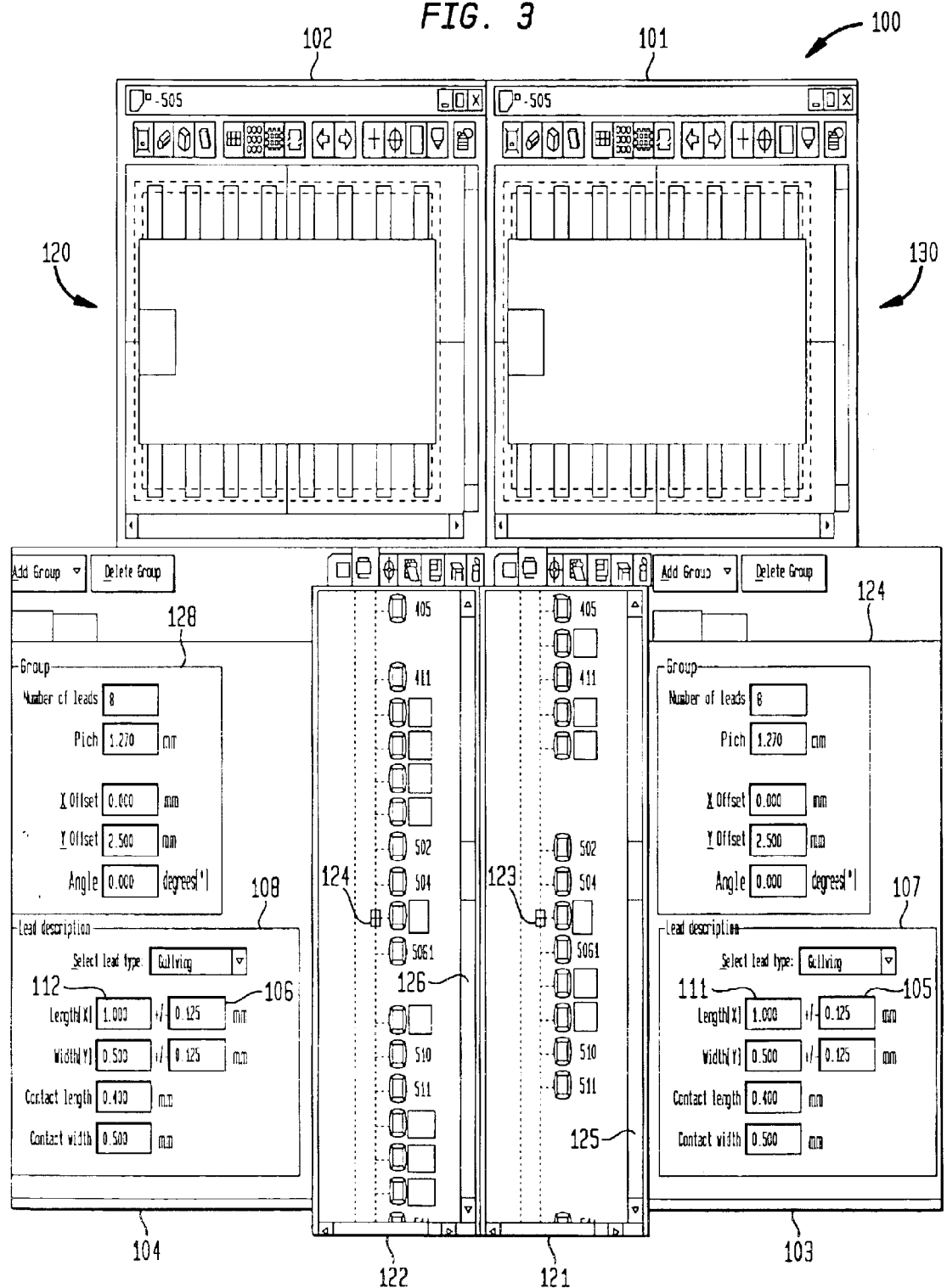

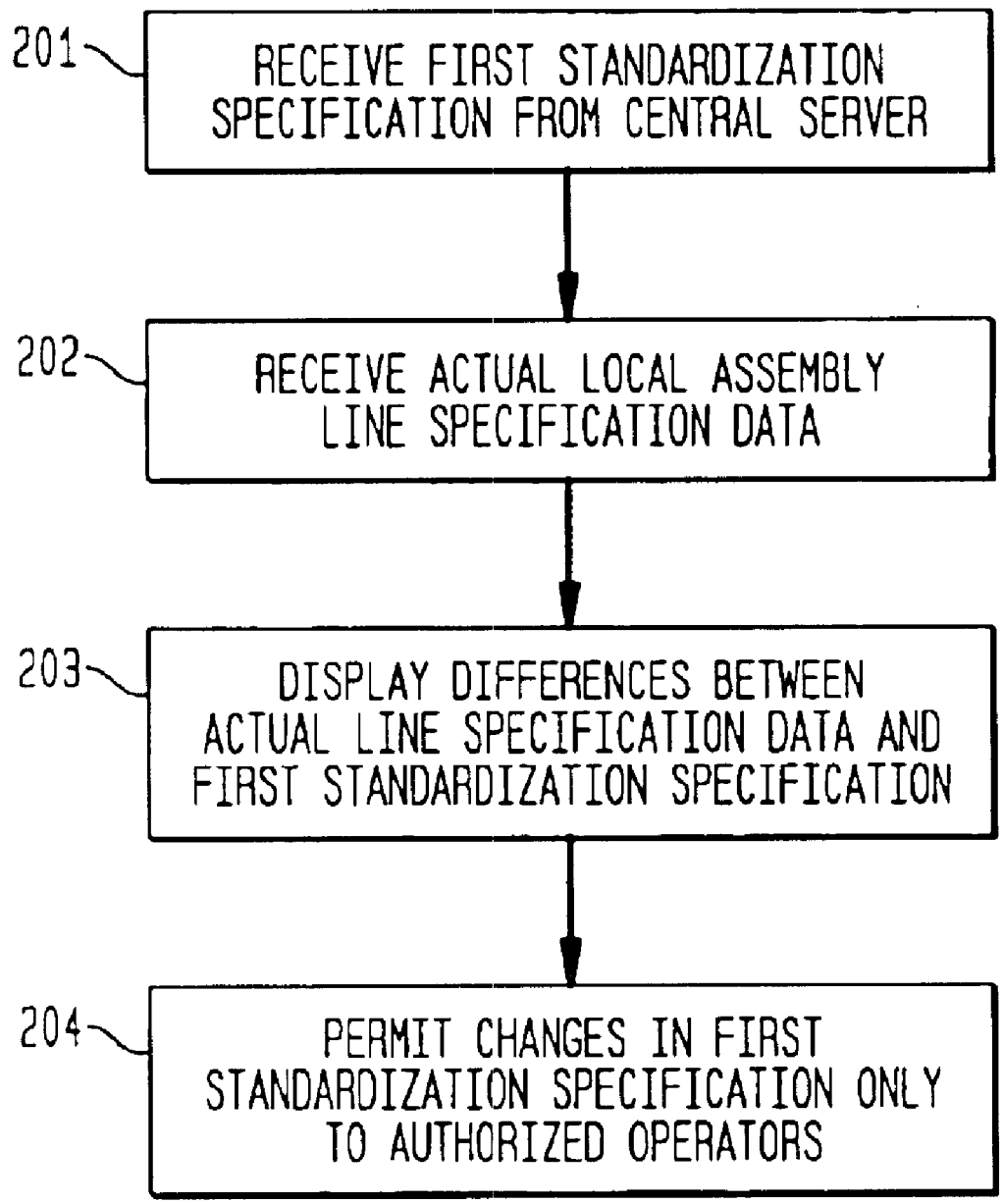

SYSTEM AND METHOD FOR COMPARING ELECTRONICS MANUFACTURING DATA

CROSS-REFERENCE TO RELATED APPLICATION

The present application claims priority from U.S. Provisional Patent Application No. 60/216,284 filed on Jul. 6, 2000, which application is hereby incorporated by reference herein.

BACKGROUND OF THE INVENTION

1. Field of the Invention

The present invention relates to the field of automated manufacturing and more particularly, to programming systems for manufacturing operations.

2. Background Information

Manufacturing operations with multiple locations require portability, or the ability to transfer information related to the manufacture of a single product among different assembly lines and different assembly sites. Manufacturing data thus should be available to all sites and assembly lines. For example, in a manufacturing process for a specific printed circuit board or panel, specific components, such as capacitors, are provided on the assembly line according to a central specification. The specification details the components, and permitted tolerances, to be used for the specific product being manufactured.

Typically, manufacturing operations run continuously so that in the event of some problem, the manufacturing process should not be interrupted. Thus, if an operator of a specific assembly line faces a problem, for example a component required by the global specification has run out, the local operator may perform a local solution, for example using lower quality components than specified in the global specification in order to permit manufacturing to continue. At a later time, an expert on the global specification can assess the local problem and determine whether the change is suitable for the entire manufacturing operation at all sites or assembly lines.

A specific example can occur in a global electronics manufacturing operation for a circuit board or panel. If all the stock of a certain capacitor is used up, a local operator may select a substitute capacitor, for example one with a similar effect but having slightly different lead wire sizes or tolerances. The substitution can require a change in the automated quality control system, which typically has a camera, that reads circuit boards to measure the dimensions of each chip and connection for comparison with vision information to obtain quality assurance. The vision information must be modified so that the circuit boards manufactured with the substitute local part are not rejected. In order to maintain proper standardization and information flow, the global manufacturer must be informed of the local change at some point. The manufacturer for example may want to change the global standardization specification based on satisfactory local changes.

Managing data from a number of different sites thus becomes a problem while attempting to maintain standardization and centralized data of products. The result is having local copies of data widely distributed, without knowing how to manage, view or organize the data.

SUMMARY OF THE INVENTION

The present invention provides a system for managing electronics manufacturing data on a geographically-distributed basis. The system includes a processor, a data storage device operably connected to the processor, the data storage device storing manufacturing standardization data and a plurality of electronic manufacturing data sets, each of the plurality of electronic manufacturing data sets corresponding to a local manufacturing process, and a difference editor executable on the processor to display differences between the at least one of the electronic manufacturing data sets and the manufacturing standardization data.

"Geographically-distributed" assembly lines as defined herein are defined as physically-separated assembly lines, whether in a same building or in various worldwide locations.

Advantageously, the differences between the data sets and the standardization data can be easily viewed using the difference editor. "Manufacturing standardization data" as defined herein is a desired set of data for a manufacturing process.

The data storage device may include a server for providing the manufacturing standardization data and a control system for providing a first of the plurality of electronic manufacturing data sets, the processor being located at the control system.

The present invention also provides a method for managing electronics manufacturing data, in which the data comprises first and second sets. The first and second sets each comprise data structures stored in at least one computer-readable storage medium, that correspond to one another but that may differ in the specific data they comprise. The method includes retrieving from the at least one computer-readable storage medium at least a portion of a first data structure from the first set, retrieving from the at least one computer-readable storage medium at least a portion of a second data structure corresponding to the second set, and permitting observation of at least one difference between the first and second data structures.

The storage medium may comprise first and second servers, with the first set of electronics manufacturing data being stored on the first server and the second set of electronics manufacturing data being stored on the second server. The first and second sets of electronics manufacturing data each may reside in a separate, respective database, and the first and second data structures may be objects.

The observation of at least one difference may be made on the basis of a graphical display and/or textual display.

The present invention also provides for a method for managing of electronics manufacturing data, in which the data comprises non-local data and local data, and the method includes the steps of permitting non-local electronics manufacturing data to be modified by a first set of persons, permitting local electronics manufacturing data to be modified by a second set of persons, and permitting a comparison between local electronics manufacturing data wherein the first and second sets of persons are not identical. The comparison may include displaying differences between the local electronics manufacturing data and the non-local electronics manufacturing data, through for example highlighting.

The present invention also provides a manufacturing system comprising a first assembly line having a first controller, the first controller containing a first set of manufacturing data related to a product manufactured by the first assembly line, a server providing a second set of manufacturing data to the first controller, and a display displaying differences between the first set of manufacturing data and the second set of manufacturing data. The second set of manufacturing data may be a standardization specification for the product and the product may be a printed circuit board.

The display preferably includes a first window for the first set of manufacturing data and a second window for the second set of manufacturing data. The first set of data may include information relating to a plurality of electric components.

Still further, the present invention provides a printed circuit board assembly line comprising at least one placement machine for placing components on a printed circuit board, a controller connected to the placement machine, and a display connected to the controller for comparing a first set of information regarding the components and a second set of information regarding desired characteristics for the components.

Another method of the present invention provides a method for displaying differences between a first set of electronics manufacturing data and a second set of electronics manufacturing data. The method includes displaying the first set of electronics manufacturing data on a section of a display, the first set of electronics manufacturing data including a list of components being used in an assembly line, displaying the second set of electronics manufacturing data on an other section of the display, the second set of electronics manufacturing data including another list of component desired to be manufactured on the assembly line, and displaying differences between the first and second set of electronics manufacturing data.

The present invention also provides a method for manufacturing a printed circuit board comprising the steps of conveying a printed circuit board, placing at least one component on the printed circuit board using a placement machine as a function of a first set of electronics manufacturing data, transferring the first set of electronics manufacturing data to a display, and comparing the first set of electronics manufacturing data with a second set of electronics manufacturing data.

BRIEF DESCRIPTION OF THE DRAWINGS

The present invention will be further elucidated with reference to a particular central server based embodiment of the present invention in which:

FIG. 3 depicts an exemplary difference editor graphical user interface (GUI) according to the present invention; and FIG. 4 shows a flowchart of a method of the present invention.

DETAILED DESCRIPTION

Figure 1:
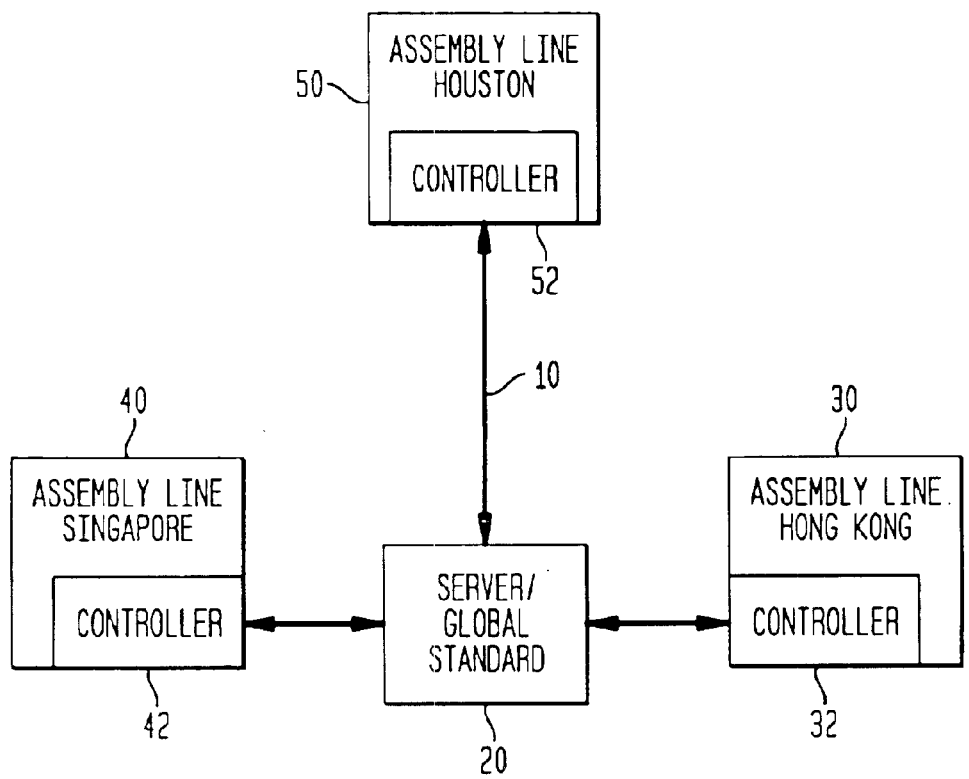
FIG. 1 is a block diagram of an exemplary manufacturing system according to the present invention.

Referring to FIG. 1, there is shown a general overview of a global manufacturing system according to the present invention. An electronic communications network 10 provides communications, preferably secured through a public/private key encryption method, between and among three different assembly lines 30, 40 and 50 and a central server 20. The geographically distributed assembly lines 30, 40 and 50, which manufacture a similar product, can be located anywhere in the world, even in a same building, as long as connection to the network 10 is available. For example, assembly line 30 can be located in Hong Kong, assembly line 40 in Singapore, and assembly line 50 in Houston, Tex. The central server 20 may be located anywhere as well and is not limited to the manufacturing sites. Computerized control systems 32, 42 and 52 reside at each site 30, 40 and 50, respectively, to automate the manufacturing process and/or vision or quality control systems of assembly lines 30, 40, 50 respectively. Control systems 32, 42, 52 may include for example processors manufactured by SIEMENS AG or the INTEL CORPORATION, and in a circuit board manufacturing process can provide control of placement machines and/or quality control or vision devices for the placement machines.

The server includes software both for providing a global standardization specification for the assembly lines 30, 40 and 50 and also for obtaining local information from each of the control systems 32, 42, 52. This software, including a graphical user interface or GUI defined herein as a difference editor, facilitates the viewing and exchange of manufacturing information among systems on the network 10. The server includes or has access to a central data storage unit and can access the manufacturing profiles from each remote site 30, 40, 50. Client versions of the software reside on each site control system 32, 42 and 52 to connect and communicate with the server.

The client versions also can contain the difference editor according to the present invention, which will be described in more detail with respect to FIG. 3. However, only persons with proper access, for example through a password, can make changes to the global specification. Access rights are granted and enforced by the server 20. At least one operator has global access rights and thus is able to access and modify the global manufacturing information that standardizes all the manufacturing sites. Those operators or personnel with only local access rights can make changes to the local manufacturing information only. The global operator using the difference editor reviews the changes made by a local operator and makes the appropriate changes on a global scale if necessary. If changes by the local operator were inappropriate, the global operator can take steps to recall the inappropriately manufactured products or to alert the proper personnel that an issue has arisen.

Figure 2:
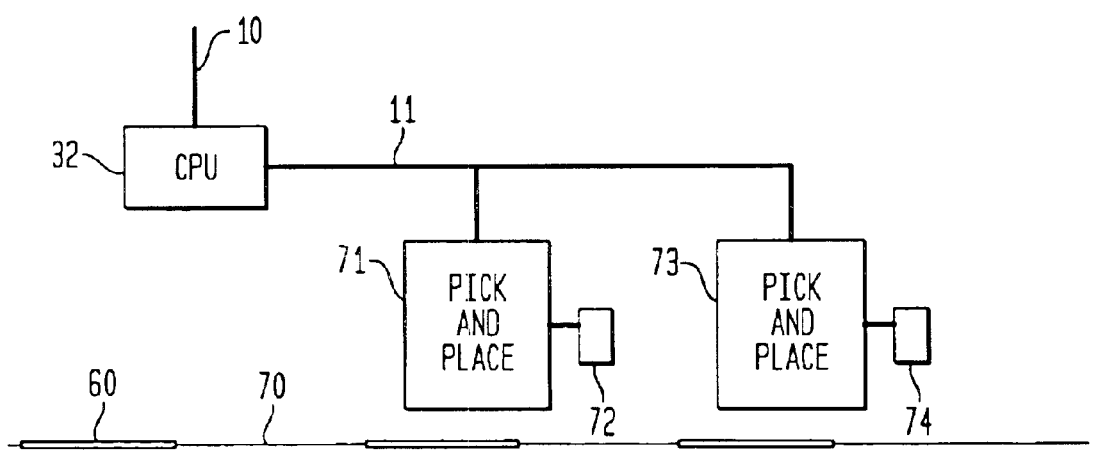
FIG. 2 shows a circuit board assembly line connected to a control computer having a connection to the server of FIG. 1.

FIG. 2 shows a specific example of an assembly line for manufacturing printed circuit boards, which can be, for example, assembly line 30 of FIG. 1. A printed circuit board 60 enters the assembly line, which has a conveyor belt 70, and a plurality of placement machines 71, 73, also known as pick and place machines. The placement machines 71, 73 place electronic components on the circuit board. The specification of the components can vary widely, and each machine can provide more than one stream of components to the circuit board, for example by having a plurality of component tape reels. For example, thirty different components may need to placed on the circuit board to produce the desired product, for example a circuit board for a mobile telephone or automobile controller.

Vision or quality control 72, 74 can check the placement and/or quality of the components placed on the circuit board 60. A network 11 connected to controller 32 can both transfer component identification information (for example from an optical character recognition (OCR) device at the placement machine) and can send placement commands to the devices 71, 72, 73 and 74.

If an OCR device to identify the components is not used, the local operator can enter the actual components being used on the line in a graphical user interface. Alternately, a bar code scanner for each component tape reel could read the identity of the components.

For example, the first component to be placed may be an SO16 (small outline with 16 leads) package identified by a number which is read by an OCR device, with the leads having a known specific lead length, lead width, contact length and contact width, as well as a given tolerance for the lead length and lead width. All of these features for a given component can match, or vary from, a global standardization specification.

FIG. 3 shows a graphical user interface (GUI) screen 100 according to the present invention for allowing a simplified device for identifying and organizing local data changes with respect to a global standard.

The left side 120 of screen 100 displays in a visual manner the desired global standardization specification. A number of components, including components 405, 411, 420, 421, 422, 501, 502, 504, 505, 504, 505, 5061, 509, 510 511, 5110, 512, 513, are shown in a component list section or tree 122. Other components can be viewed by scrolling within the section 122. The numbers identify a specific component to be placed by a pick-and-place machine in a specific location on the printed circuit board.

A detail section 104 contains information about a specific component 505, indicated by a checked box 127 in window 122, including component group characteristics 128 such as the number of leads for the component, the pitch, the X offset, the Y offset, and the angle. In a lead description section 108, the type of lead, lead length and tolerance, lead width and tolerance, and lead contact length and width are displayed.

A viewer section 102 displays a graphical image of the component 505, which is an SO16 package.

A right side 130 of display 100 shows the actual local configuration of the assembly line, for example assembly line 30 in FIG. 1. Assembly line 30 could have been producing a similar product or is being switched over to produce a similar product to that shown in the global specification 120. In a local component section or tree 121, the components being placed in the local assembly line are shown, including among others components 405, 410, 411, 420, 421, 502, 504, 505, 5061, 508, 509, 510 and 511.

The details of local component 505 are shown in section 103, which includes a group window 124 and lead window 107. The component 505, indicated by marker 123, is also displayed in a visual representation in a window 101.

The present invention permits for simple identification of differences between a global standard 120 and a local implementation 130. In a preferred embodiment, all the differences may be highlighted, including in windows 122, 121, 104, 103, 102 and 101.

As shown in window 121, components 410, 420, 421, 505, 509 differ from the specification because they are either not present or have different dimensions or characteristics. For example, component 505 is highlighted because of a difference with the standard 120, so that the particular dimension that is affected is highlighted. Component 505 is also present in standard 120 as shown in window 122.

With component 505, the part length deviation changed. Therefore, the text box 106 containing the length deviation for the original part in the "Lead description" box 108 is highlighted. The corresponding text box 105 in the "Lead description" box 107 for the length deviation value of the substitution part is highlighted as well.

In this case, the global standard for component 505 requires a lead length of 1.000 mm with a permissible deviation of +/−0.200, as indicated in text box 106 of window 104. The substitute part has a length of 1.000 mm with a length deviation of +/−0.225, as indicated in text box 105 of window 103, which is highlighted as well. Thus, the local component has violated the global standard. For example, the local manufacturing line operator may not have been able to obtain parts with the required lead tolerance and thus was forced to use local parts with lesser lead line quality. Using the difference editor 100, the global operator, who can be an expert in manufacturing technology, can quickly assess the change made locally. The global operator can then inform the local operator that the change was acceptable or unacceptable, and can, if desired, modify the global standard. Advantageously, the global standard could be changed using a drag and drop function, so that, for example, the global operator in charge of the standardization specification can click a mouse on local component 505 in window 121 and can drag the image over to global component 505 in window 122 so that the global standard is changed to that of the local usage. Alternately, the global operator can simply type in the new values if a change is desired.

Since the difference between the global component 505 and the local component 505 is in the lead section, the images of the leads in window 101 is also highlighted.

The present invention can also help a local operator organize a new manufacturing operation by highlighting every difference between a new global standard and the current makeup of the local assembly line. For example, the local operator can see in window 122 that highlighted components 422, 501, 5110, 512 and 513 are not present in the local version.

Navigation in the tree controls 121,122 may be done individually, or synchronously so that navigation in one tree control box is mirrored in the other. The navigation mode is selected with a check box or any other visible and easily accessible method. For example, in a synchronous mode, any point-and-click action in the tree control box 121 is mirrored in the tree control box 122. Selection of an object in tree control box 121 automatically causes the same object to be selected in box 122. Scrolling through the menu by clicking on a scroll bar is also mirrored so that manipulation of the scroll bar 126 causes the same manipulation to occur in box 121. The reverse is also true, so moving the scroll bar 125 causes the scroll bar 126 to move with the scroll bar 125 in sync. Synchronization of scrolling is especially advantageous when comparing two libraries.

Individual control allows selection of different objects and separate navigation between both boxes so that different icons can be selected in the tree control box 121 and the tree control box 122. With respect to navigation through the boxes 121 and 122 by the scroll bars 125 and 126, one box 121 can display the top of the tree control in its scroll bar 125 while the other box 122 displays another section of the tree control structure.

FIG. 4 shows a flow chart of one embodiment of a method of the present invention. A first standardization specification can be received at a local assembly line in step 201. The standardization data can be provided in simple vectored format, for example (component number, number of leads, pitch, etc. . . . ). The actual local assembly line data can be received by the local controller in step 202. The actual component data used is provided in vectored format as well. The actual component data can be generated for example using an OCR device on the assembly line which identifies a component identification such as a number, and interacts with a database to provide the actual component data. In step 203, the differences in the data are displayed by the difference editor. The GUI may be programmed in, for example, C++ and requires a simple comparison function of the vectored data. The highlighting and image generation can also be performed using C++ program steps.

As shown in step 204, authorized operators may make changes to the first standardization specification. Other authorized personnel may make changes to the local assembly line.

The server and the controllers may have both a processor and a data storage device for storing the program executing the method of the present invention. The controllers also may function as servers for providing information to client computers or a network. The communications network 10 may be for example a dedicated line or a global information network, such as the Internet.

The data structures may be C++ objects. "Global data" as used herein is defined as any data used for more than one assembly line.

While the present invention has been described with package forms in a circuit board assembly line, the difference editor could also be used to display differences in other features, for example set-ups, oven profiles, or multi-up panel characteristics for the assembly lines.

What is claimed is:

1. A system for managing electronics manufacturing data comprising:

a processor;

a data storage device operably connected to the processor, the data storage device storing global manufacturing standardization data and a plurality of electronic manufacturing data sets, each of the plurality of electronic manufacturing data sets corresponding to a local manufacturing process; and a difference editor executable on the processor to display differences between the at least one of the electronic manufacturing data sets and the global manufacturing standardization data.

2. The system of claim 1 wherein the data storage device includes a server for providing the manufacturing standardization data.

3. The system as recited in claim 2 wherein the data storage device further includes a control system for providing a first of the plurality of electronic manufacturing data sets, the processor being located at the control system.

4. The system as recited in claim 1 wherein the data storage device includes a central server for providing the manufacturing standardization data, a first control system for providing a first of the plurality of electronic manufacturing data sets, and a second control system for providing a first of the plurality of electronic manufacturing data sets.

5. A method for managing of electronics manufacturing data, in which the data comprises global data used for a plurality of assembly lines and local data used at one of the plurality of assembly lines, comprising the steps of:

permitting global electronics manufacturing data to be modified by a first set of persons;

permitting local electronics manufacturing data to be modified by a second set of persons;

displaying differences between the local electronics manufacturing data and the global electronics manufacturing data as to permit a comparison between local electronics manufacturing data and global electronic manufacturing data wherein the first and second sets of persons are not identical.

6. The method as recited in claim 5 wherein the displaying step includes displaying a graphical representation of an electronic component.

7. The method as recited in claim 5 wherein the displaying step includes highlighting the differences.

8. The method as recited in claim 5 wherein the displaying step includes displaying lead information of an electronic component.

9. The method as recited in claim 5 wherein the local electronics manufacturing data includes information regarding a length of electronic component leads.

10. The method as recited in claim 5 wherein the global electronics manufacturing data includes a specification for a length of electronic component leads.

11. A manufacturing system comprising:

a first assembly line having a first controller, the first controller containing a first set of manufacturing data related to a product manufactured by the first assembly line;

a second assembly line remote from the first assembly line and having a second controller, the second controller containing a second set of manufacturing data related to a product manufactured by the second assembly line, the products of the first and second assembly lines being similar products;

a central server providing a global standardization specification for the products to the first controller and to the second controller; and a display displaying differences between a set of manufacturing data and the global standardization specification.

12. The manufacturing system as recited in claim 11 wherein the product is a printed circuit board.

13. The manufacturing system as recited in claim 11 wherein the display includes a first window for the first set of manufacturing data and a second window for the second set of manufacturing data.

14. The manufacturing system as recited in claim 11 wherein the first set of data includes information relating to a plurality of electric components.

15. A method for displaying differences between a first set of electronics manufacturing data and a second set of electronics manufacturing data comprising the steps of:

displaying the first set of electronics manufacturing data on a section of a display, the first set of electronics manufacturing data including a list of components being used in an assembly line;

displaying the second set of electronics manufacturing data on an other section of the display concurrently with the displayed first set of electronics manufacturing data, the second set of electronics manufacturing data including another list of component desired to be manufactured on the assembly line; and displaying differences between the first and second set of electronics manufacturing data.

16. The method as recited in claim 15 wherein the differences are displayed through highlighting.

17. The method as recited in claim 15 wherein the assembly line is a printed circuit board assembly line.

* * * * *